(12) United States Patent  
Sbuell et al.

(10) Patent No.: US 8,965,280 B2  
(45) Date of Patent: Feb. 24, 2015

(54) CHIP CARD COMMUNICATION ARRANGEMENT AND CHIP CARD COMMUNICATION CIRCUIT

(75) Inventors: Richard Sbuell, Graz (AT); Walter Kargl, Graz (AT); Matthias Emsenhuber, Graz (AT)

(73) Assignee: Infineon Technologies AG, Neubiberg (DE)

( * ) Notice: Subject to any disclaimer, the term of this patent is extended or adjusted under 35 U.S.C. 154(b) by 164 days.

(21) Appl. No.: 13/602,397

(22) Filed: Sep. 4, 2012

(65) Prior Publication Data

US 2014/0065981 A1 Mar. 6, 2014

(51) Int. Cl.  
*H04B 5/00* (2006.01)

(52) U.S. Cl.  
USPC ............. 455/41.1; 455/41.2; 455/73; 455/91; 455/129; 455/248.1

(58) Field of Classification Search  
CPC .......... H03H 7/38; H03H 7/004; H03H 2/005

USPC ............. 455/41.1, 73, 77, 78, 558, 333, 41.2, 455/91, 129, 107, 130, 248.1, 252.1, 274, 455/319, 320

See application file for complete search history.

(56) References Cited

U.S. PATENT DOCUMENTS

| 6,176,433 | B1 * | 1/2001 | Uesaka et al. | 235/492 |
| 6,735,418 | B1 * | 5/2004 | MacNally et al. | 455/78 |
| 2008/0299913 | A1 * | 12/2008 | Han et al. | 455/83 |
| 2011/0036912 | A1 * | 2/2011 | Guo et al. | 235/492 |
| 2011/0057654 | A1 * | 3/2011 | Sun et al. | 324/318 |

* cited by examiner

*Primary Examiner* — Tuan Pham

(57) ABSTRACT

According to an embodiment, a chip card communication arrangement is provided comprising a matching network and a chip card communication circuit comprising at least one matching network terminal, a receiver coupled to the matching network via the at least one matching network terminal and an active transmitter coupled to the matching network via the at least one matching network terminal.

16 Claims, 5 Drawing Sheets

US 8,965,280 B2

CHIP CARD COMMUNICATION ARRANGEMENT AND CHIP CARD COMMUNICATION CIRCUIT

TECHNICAL FIELD

The present disclosure relates to chip card communication arrangements and chip card communication circuits.

BACKGROUND

On a chip card with a wireless communication interface, a chip card communication circuit is typically connected to an antenna of the chip card by means of a tuning network, e.g. for impedance matching. It is generally desirable to provide chip card components (such as the chip card communication circuit and the tuning network) at low costs while having a good wireless communication performance.

SUMMARY

According to an embodiment, a chip card communication arrangement is provided including a matching network and a chip card communication circuit including at least one matching network terminal, a receiver coupled to the matching network via the at least one matching network terminal and an active transmitter coupled to the matching network via the at least one matching network terminal.

According to another embodiment, a chip card communication circuit is provided including at least one matching network terminal, a receiver, an active transmitter, and a controller configured to, depending on the value of a control signal, couple either the receiver to the at least one matching network terminal to receive signals from the at least one matching terminal or the transmitter to the at least one matching network terminal to transmit signals to the at least one matching terminal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. These aspects of this disclosure are described in sufficient detail to enable those skilled in the art to practice the invention. Other aspects of this disclosure may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Contact-less data communication may be performed by separated RxD (receive exchange data) and TxD (transmit exchange data) signal branches connected to a single antenna via an antenna tuning network. This is illustrated in FIG. 1.

Figure 1:
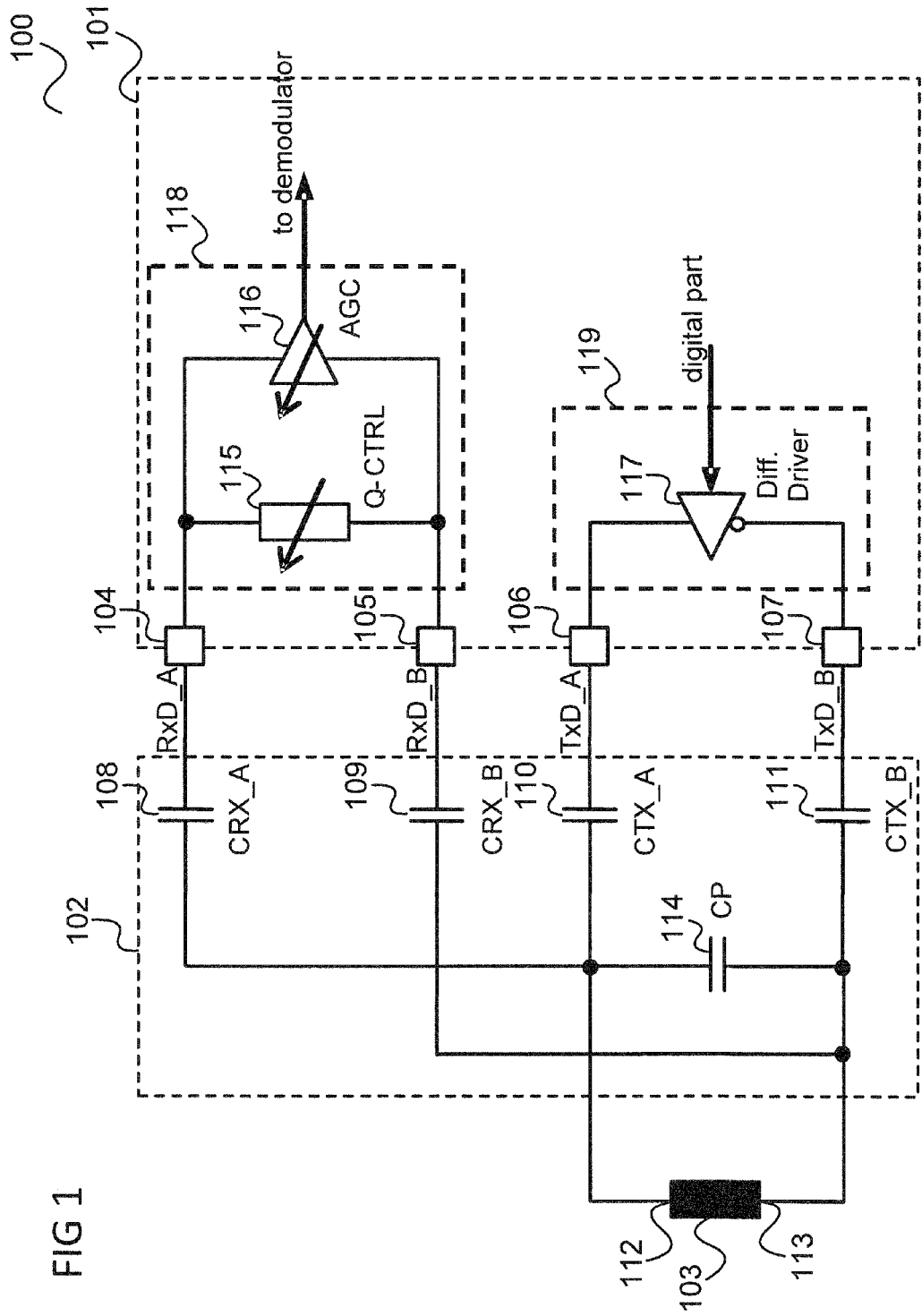
FIG. 1 shows a chip card communication arrangement.

FIG. 1 shows a chip card communication arrangement 100.

The chip card communication arrangement 100 is for example arranged on a chip card.

The chip card communication arrangement 100 includes a chip card communication circuit 101, a matching network 102 and an antenna 103.

The communication circuit 101 includes a first matching network terminal 104, a second matching network terminal 105, a third matching network terminal 106 and a fourth matching network terminal 107.

The matching network 102 includes a first capacitor 108 coupled between the first matching network terminal 104 and a first terminal of the antenna 112.

The matching network 102 further includes a second capacitor 109 coupled between the second matching network terminal 105 and a second terminal of the antenna 113.

The matching network 102 further includes a third capacitor 110 coupled between the third matching network terminal 106 and the first terminal of the antenna 112.

The matching network 102 further includes a fourth capacitor 114 coupled between the fourth matching network terminal 107 and the second terminal of the antenna 113.

Additionally, the matching network 102 includes a fifth capacitor 114 which is coupled in parallel to the antenna 103.

The chip card communication circuit 101 includes a quality factor control loop 115 and an auto gain control loop 116 which are both connected between the first matching network terminal 104 and the second matching network terminal 105. The auto gain control loop 116 has an output connected to a demodulator (not shown) which may be part of the chip card communication circuit 101 and which may demodulate signals received by the chip card communication arrangement 100 via the antenna 103. The quality factor control loop 115 and the auto gain control loop 116 may be seen to implement (or be part of) a transmit data (TxD) branch 118 of the chip card communication circuit 101.

The chip card communication circuit 101 further includes a differential driver 117 coupled between the third matching network terminal 106 and the fourth matching network terminal 107. The differential driver 117 has an input via which it may receive a signal to be sent via the antenna 103, for example from one or more digital components (not shown) which may be part of the chip card communication circuit 101. The differential driver 117 may be seen to implement (or be part of) a receive data (RxD) branch 119 of the chip card communication circuit 101.

The matching network (or tuning network) 102 implements a transmit (TX) path by means of the third capacitor 110, the fourth capacitor 111 and the fifth capacitor 114 and implements a receive (RX) path by means of the first capacitor 108, the second capacitor 109 and the fifth capacitor 114. The transmit path is connected to the chip card communication circuit (e.g. a chip card controller) 101 by means of the third matching network terminal 106 and the fourth matching network terminal 107 (which can be seen as TX pads) and the receive path is connected to the chip card communication circuit 101 by means of the first matching network terminal 104 and the second matching network terminal 105 (which can be seen as RX pads). Thus, the receive path and the transmit path are connected to the chip card communication circuit via separate RX pads and TX pads.

The quality factor control loop 115 limits the input voltage at the RX pads 104, 105 and the auto gain control loop 116 delivers a defined output voltage for the demodulator connected to the RxD branch 118. If the input voltage at the RX pads 104, 105 is below a certain value the quality factor control loop is disabled. The differential driver (circuit) 117 generates a rectangular voltage signal supplied to the TX path of the matching network 102 via the TX pads 106, 107.

If data reception (RXD) mode is activated the differential driver 117 in the TxD branch 119 is disabled. This means that the TX pads 106, 107 are high impedance nodes in this case. The input voltage at the RX pads 104, 105 is controlled by the quality factor control loop 115. Therefore the signal bandwidth available for data reception varies in a certain range in dependency of the adjusted quality factor. The input voltage is then amplified or attenuated by the auto gain control loop 116 to deliver a certain signal voltage level to the demodulator connected to the RXD branch 118.

In case that no active data transmission (TxD) mode is activated the differential driver 117 in the TxD branch 119 generates a rectangular voltage signal at the TX pads 106, 107. The signal is amplified by the quality factor of the RX path of the matching network 102. Due to this fact the antenna voltage is significantly increased compared to the RxD mode and therefore an overvoltage protection needs typically to be implemented that limits the input voltage on the RX pads 104, 105 at a certain voltage level so that the circuitry in the RxD branch 118 is not damaged.

It should be noted that implementing separate pads for the RxD branch and the TxD branch increases chip area and the risk of ESD damage.

Further, the antenna tuning network, i.e. the matching network 102, implements separate paths for the RxD branch and the TxD branch which requires five additional external components in this example.

In RxD mode the input voltage at the RX pads 104, 105 is controlled by varying the quality factor. Therefore the signal bandwidth available for data reception varies in a certain range affecting the data reception performance.

In TxD mode the RxD branch operates in overvoltage protection mode limiting the input voltage at the RX pads 104, 105. Therefore power is drained from the antenna via the first capacitor 109 and the second capacitor 110 which decreases data transmission performance.

According to one embodiment, the RX pads 104, 105 and the TX pads 106, 107 can be seen to be combined. This is illustrated in FIG. 2.

Figure 2:
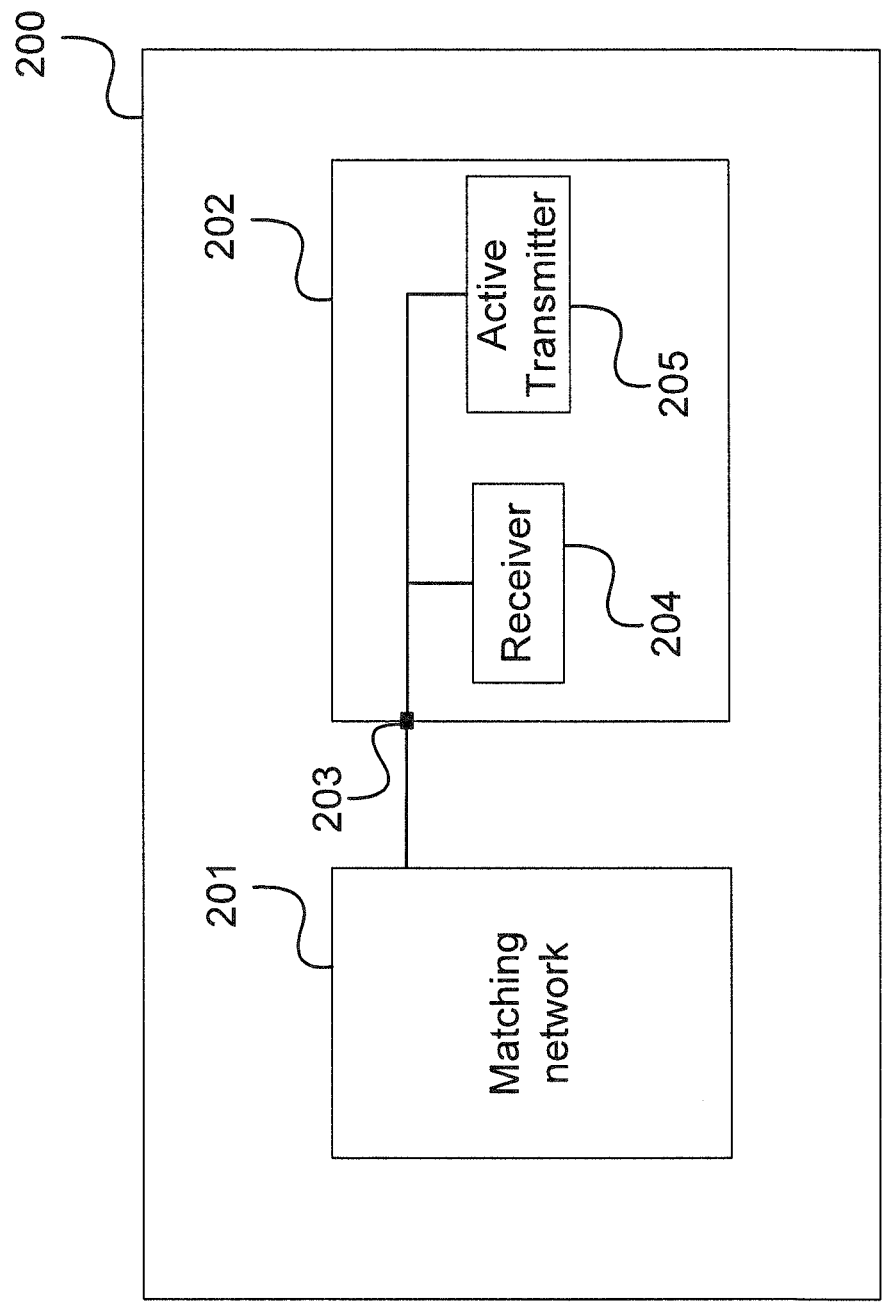
FIG. 2 shows a chip card communication arrangement according to an embodiment.

FIG. 2 shows a chip card communication arrangement 200 according to an embodiment.

The chip card communication arrangement 200 includes a matching network 201.

The chip card communication arrangement 200 further includes a chip card communication circuit 202 including at least one matching network terminal 203; a receiver 204 coupled to the matching network via the at least one matching network terminal and an active transmitter 205 coupled to the matching network via the at least one matching network terminal.

In other words, according to one embodiment, the transmit branch and the receive branch (or the transmitter components and the receiver components) of a chip card share the same connection terminals to a matching network via which they are connected to an antenna.

According to one embodiment, an antenna interfacing concept for a chip card communication circuit (e.g. a chip card controller) is provided that supports active data transmission as well as data reception via a single signal path by merging the RX path and the TX path (e.g. of the matching network). Merging of these two paths is according to one embodiment accomplished by adapting the RxD branch of the chip card communication circuit, combining RX pads with the TX pads and adapting the matching network in a way such that it suits for active data transmission as well as data reception.

For example, an antenna interfacing concept for contact-based supplied dual-interface chip cards is provided. According to one embodiment, a chip card supports contact-less data communication wherein active data transmission as well as data reception are performed via two combined RxD/TxD pads connected to a single antenna via an antenna tuning network.

According to one embodiment, the chip card communication circuit implements two combined pads for active data transmission as well as data reception which leads to a decreased chip area and a decreased risk of ESD (electrostatic discharge) damage compared to separate transmit and receive pads.

According to one embodiment, the antenna tuning network is commonly used for active data transmission as well as data reception and may be implemented with only three additional external components.

According to one embodiment, the quality factor of the antenna interface varies in a very small range. Therefore the bandwidth available for data reception is more or less constant.

According to one embodiment, the RxD branch does not implement an overvoltage protection such that no power is drained from the antenna in TxD mode.

In other words, according to one embodiment, area of the chip card communication circuit may be reduced and its ESD robustness may be improved by saving two additional pads. The number of external components needed for the tuning network may be minimized and RxD communication performance may be improved.

The chip card communication arrangement may be arranged on a chip card, e.g. a dual-interface chip card with contact-based power supply. It may be connected to an antenna that may be part of the chip card but that may also be an external antenna. The chip card communication circuit may include, may be implemented by or may be connected to a circuit or chip that provides signals to be sent by the chip card communication arrangement or which is supplied by the chip card communication circuit with signals received by the chip card communication circuit. For example, this circuit or chip includes a demodulator for demodulating received signals or a digital component providing a signal to be supplied to the antenna.

The transmitter 205 is an active transmitter, e.g. a transmitter that actively generates a signal to be supplied to the antenna, in other words which for example drives the antenna, e.g. provides a certain output power to the antenna (i.e. supplies power to the antenna), for example in contrast to a transmission by load modulation. The active transmitter may for example be supplied with power via a contact-based interface of a chip card including the chip card communication arrangement and may supply power to the antenna.

According to one embodiment, the chip card communication arrangement includes a first matching network terminal and a second matching network terminal, wherein the receiver is coupled to the matching network via the first matching network terminal and the second matching network terminal and the active transmitter is coupled to the matching network via the first matching network terminal and the second matching network terminal.

The matching network is for example configured such that its input impedance at the first matching network terminal and the second matching terminal matches the output impedance at the first output terminal and the second output terminal of the transmitter. In other words, the matching network may be adapted for impedance matching for the transmitter.

The receiver may include a first input terminal coupled to the first matching network terminal and a second input coupled to the second matching network terminal.

According to one embodiment, the active transmitter includes a first output terminal coupled to the first matching network terminal and a second output terminal coupled to the second matching network terminal.

The chip card communication arrangement may further include an antenna coupled to the matching network.

The antenna is for example coupled to the matching network such that the receiver and the transmitter are coupled to the antenna via the matching network.

According to one embodiment, the matching network includes a first capacitor coupled in parallel to the antenna and a second capacitor coupled serially between the antenna and the at least one matching network terminal.

For example, the second capacitor is coupled serially between the antenna and the first matching network terminal and the matching network includes a third capacitor coupled serially between the antenna and the second matching network terminal.

The chip card communication circuit is for example arranged on a chip card.

The matching network may also be arranged on the chip card.

The chip card communication arrangement may further include an antenna which is arranged on the chip card.

The chip card is for example a dual interface card.

The active transmitter for example includes a differential driver.

The chip card communication arrangement for example further includes a digital signal source coupled to an input of the transmitter and configured to supply a signal to be transmitted to the transmitter.

The chip card communication arrangement may for example further include a demodulator coupled to the receiver and configured to demodulate a signal received by the receiver.

According to one embodiment, the receiver includes a control loop configured to generate a peak voltage controlled signal from a signal supplied by the matching network to the receiver.

Figure 3:
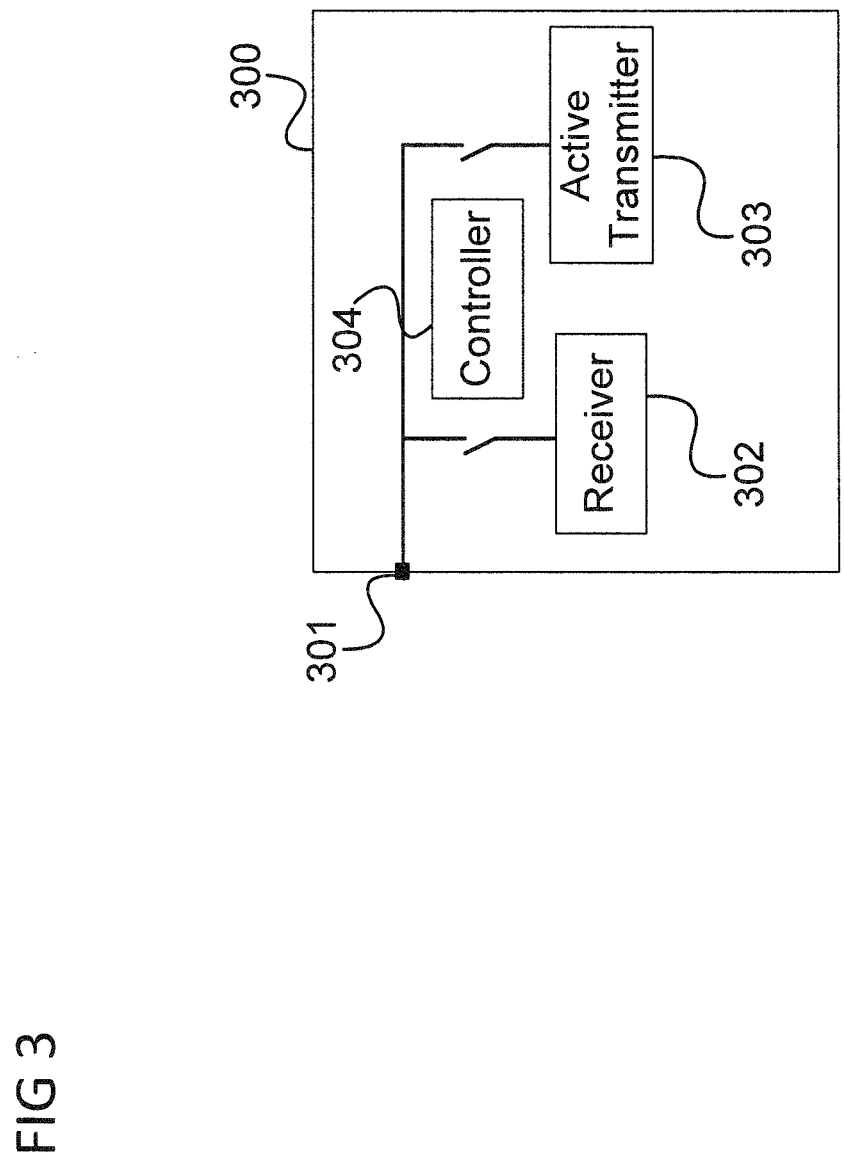
FIG. 3 shows a chip card communication circuit according to an embodiment.

The chip card communication circuit may for example have a structure as illustrated in FIG. 3.

FIG. 3 shows a chip card communication circuit 300 according to an embodiment.

The chip card communication circuit 300 includes at least one matching network terminal 301, a receiver 302 and an active transmitter 303.

The chip card communication circuit 300 further includes a controller 304 configured to, depending on the value of a control signal, couple either the receiver 302 to the at least one matching network terminal 301 to receive signals from the at least one matching terminal or the transmitter 303 to the at least one matching network terminal 301 to transmit signals to the at least one matching terminal 301.

The components of the chip card communication arrangement (e.g. the receiver and the transmitter) may for example be implemented by one or more circuits. A "circuit" may be understood as any kind of a logic implementing entity, which may be special purpose circuitry or a processor executing software stored in a memory, firmware, or any combination thereof. Thus a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit".

"Coupled" may be understood as electrically conductively coupled (or connected) or galvanically coupled.

When the receiver is coupled to the 302 is coupled by the controller to the matching terminal (and by means of the matching terminal for example to a matching network an antenna), the transmitter is decoupled (disconnected) from the matching terminal and vice versa. This may for example be performed by setting the outputs of the transmitter (or the inputs of the receiver, respectively) to an high impedance state.

The controller is for example configured to receive the control signal, e.g. from another component arranged on a chip card including the chip card communication circuit 300, e.g. from another component of a chip card module including the chip card communication circuit 300.

According to one embodiment, the control signal indicates a transmission mode or a reception mode and the controller configured to couple the receiver to the at least one matching network terminal to receive signals from the at least one matching terminal in case that the control signal indicates a reception mode and to couple the transmitter to the at least one matching network terminal to transmit signals to the at least one matching terminal in case that the control signal indicates a transmission mode.

For example, the control signal has two possible values, wherein one value indicates transmission mode and the other value indicates reception mode. The value of the control signal for example changes in accordance with a time division duplexing scheme between transmission and reception. The value of the control signal may for example be controlled by a chip card processor depending on whether the processor wants to transmit or receive data, e.g. to or from a chip card reader.

It should be noted that embodiments described with the chip card communication arrangement 400 are analogously valid for the chip card communication circuit 300 and vice versa.

An example for a chip card communication arrangement is described in the following with reference to FIG. 4.

Figure 4:
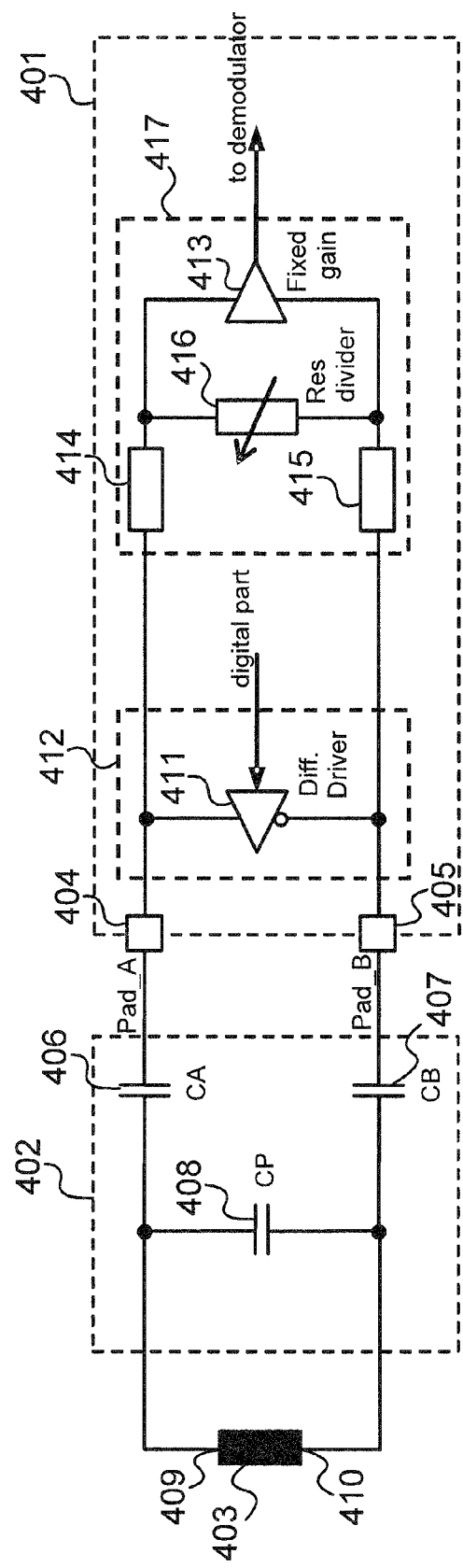
FIG. 4 shows a chip card communication arrangement according to an embodiment.

FIG. 4 shows a shows a chip card communication arrangement 400.

The chip card communication arrangement 400 is for example arranged on a chip card.

The chip card communication arrangement 400 includes a chip card communication circuit 401, a matching network (or antenna tuning network) 402 and an antenna 403.

The chip card communication circuit 401 includes a first matching network terminal 404 and a second matching network terminal 405.

The matching network 402 includes a first capacitor 106 coupled between the first matching network terminal 404 and a first terminal of the antenna 409, a second capacitor 407 coupled between the second matching network terminal 405 and a second terminal of the antenna 410 and a third capacitor coupled in parallel to the antenna 403.

The chip card communication circuit 401 includes a differential driver 411 implementing (or being part of) a transmit data (TxD) branch 412. The differential driver 411 has an input via which it may receive a signal to be sent via the antenna 403, for example from one or more digital components (not shown) which may be part of the chip card communication circuit 401.

The chip card communication circuit 401 further includes a fixed gain amplifier (e.g. a differential amplifier) with an output coupled to a demodulator (not shown) which may be part of the chip card communication circuit 401 and which may demodulate signals received by the chip card communication arrangement 400 via the antenna 403.

The chip card communication circuit 401 further includes a first resistor 414 coupled between the first matching network terminal 404 and the fixed gain amplifier 413 and a second resistor 415 coupled between the second matching network terminal 404 and the fixed gain amplifier 413. Further, a variable resistor 416 is connected in parallel to the fixed gain amplifier 413 (in other words between the inputs of the fixed gain amplifier 413). The resistors 415 and the variable resistor form a resistor divider.

The resistors 414, 415, the variable resistor 416 and the fixed gain amplifier 413 implement (or are part of) a receive data (RxD) branch 417.

The tuning network 402 is suitable for active data transmission as well as data reception. The tuning network 402 is connected to the chip card communication circuit 401 via combined the matching network terminals 404, 405 which may be seen as combined RX/TX pads.

The chip card communication circuit 401 has a transmit data (TxD) mode and a receive data (RxD) mode. For example the chip card communication circuit 401 is in either TxD mode or in RxD mode according to an input signal (e.g. of a controller of the chip card) and/or in accordance with a time multiplexing between transmitting (i.e. operation in TxD mode) and receiving (i.e. operation in RxD mode).

In the case that data reception (RxD) mode is activated the differential driver 411 is disabled. This means that the RX/TX pads 404, 405 are high impedance nodes. The voltage at the RX/TX pads 404, 405 is not controlled and therefore varies in dependency from the field strength received by the antenna 101. Due to this fact the quality factor of the antenna interface only changes in a very small range as it is mainly defined by the antenna inductance, antenna equivalent serial resistance and the third capacitor 408. Therefore the bandwidth available for data reception may be more or less constant. The voltage at the RX/TX pads 404, 405 is internally supplied to the RxD branch 417 and divided by means of the variable resistor 416 to deliver a certain signal voltage level to the fixed gain amplifier 413 providing the signal for the demodulator.

In case of active data transmission, i.e. in case that TxD mode is activated, the differential driver 411 in the TxD branch 412 generates a rectangular voltage signal at the TX/RX pads 404, 405. The signal is amplified by the quality factor of the antenna tuning network 402. The RxD branch 417 is in this case disabled.

Another example of a chip card communication arrangement which may for example be arranged on a chip card is described in the following with reference to FIG. 5.

Figure 5:
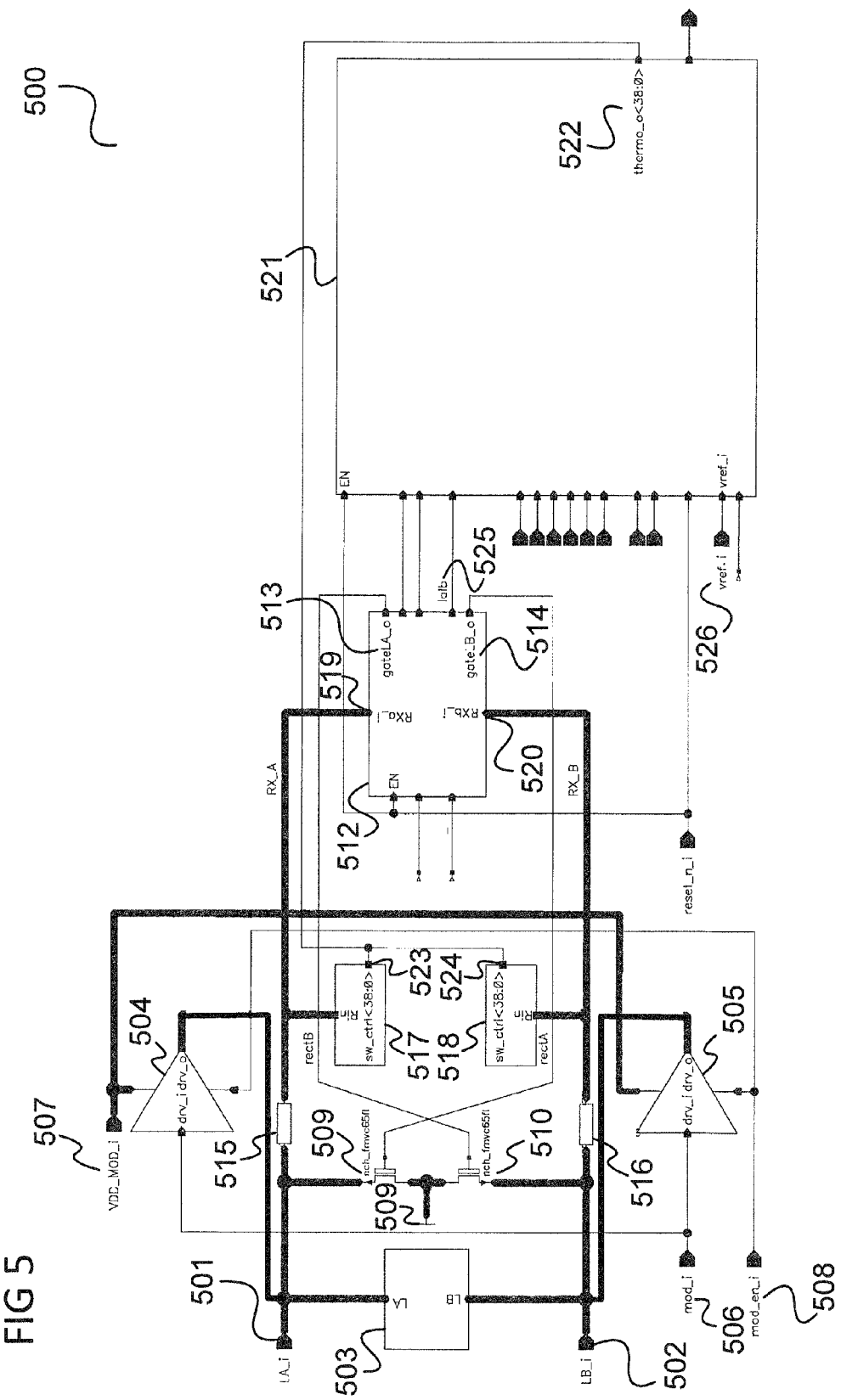
FIG. 5 shows a chip card communication arrangement according to an embodiment.

FIG. 5 shows a chip card communication arrangement 500 according to an embodiment.

The chip card communication arrangement 500 includes a first matching network terminal 501 and a second matching network terminal 502 for connecting the two terminals of an antenna (not shown). The antenna may be for example connected between the first matching network terminal 501 and the second matching network terminal 502.

An emergency clamp circuit 503 is connected between the first matching network terminal 501 and the second matching network terminal 502. The emergency clamp circuit 503 limits the maximum voltage between the first matching network terminal 501 and the second matching network terminal 502 (which can be seen as the combined RxD/TxD pads in this example) to protect the circuitry of the various modules of the chip card communication arrangement 500.

The chip card communication arrangement 500 implements a TxD branch and an RxD which are connected in parallel to the RxD/TxD pads 501, 502.

The TxD branch is implemented by a first differential driver 504 and a second differential driver 505 driving a square voltage signal controlled by a signal mod_i 505, which is for example digital component providing the signal to be transmitted, at the RxD/TxD pads 501, 502 in case that the chip card communication arrangement is in RxD mode. The differential drivers 504, 505 receive the signal mod_i 505 as input. The output of the first differential driver 504 is connected to the first matching network terminal 501 and the output of the second differential driver 505 is connected to the second matching network terminal 502.

The high-level voltage of the square voltage signal is defined by the voltage of a power supply signal VDD_MOD_i 507 (supply voltage) of the TxD branch which is supplied to the first differential driver 504 and the second differential driver 505. The differential drivers 504, 505 are further supplied with a mod_en_i signal 508 (enable signal) which activates the differential drivers 504, 505 in TxD mode.

During data transmission, i.e. in TxD mode, the RxD branch is disabled.

The chip card communication arrangement further includes an active rectifier formed by an active rectifier circuit 512, a first rectifier switch 509 connected between the first matching network terminal 501 and VSS 511 and controlled by a gateLA_o signal 513 output by the active rectifier circuit 512 and a second rectifier switch 510 connected between the second matching network terminal 502 and VSS 511 and controlled by a gateLB_o signal 514 output by the active rectifier circuit 512.

The active rectifier control circuit 512 controls the rectifier switches 509, 510 by means of the gateLA_o signal 513 and the gateLB_o signal 514. The active rectifier circuit 512 connects the second matching network terminal 502 to VSS if the signal received at the first matching network terminal (denoted as LA_i) is positive and connects the first matching network terminal 501 to VSS if the signal received at the second matching network terminal (denoted as LB_i) is positive by a corresponding control of the rectifier switches 509, 510.

The RxD branch is implemented by a digitally controlled resistor voltage divider including a first resistor 515, a second resistor 516, a first digitally controlled resistor 517 and a second digitally controlled resistor 518.

The active rectifier control circuit 512 receives the signal received at the first matching network terminal 501 (denoted as LA_i) by means of a first input 519 via the digitally controlled resistor voltage divider (this signal as received by the active rectifier control circuit 512 is denoted as RX_A). The active rectifier control circuit 512 receives the signal received at the second matching network terminal 502 (denoted as LB_i) by means of a second input 520 via the digitally controlled resistor voltage divider (this signal as received by the active rectifier control circuit 512 is denoted as RX_B).

The first resistor 515 is coupled between the first matching network terminal 501 and the first input 519. The second resistor 516 is coupled between the second matching network terminal 502 and the second input 520. The first digitally controlled resistor 517 is connected to the first input 519 and the second digitally controlled resistor 518 is connected to the second input 520.

The first digitally controlled resistor 517 and the second digitally controlled resistor 518 receive a control signal 522 controlling their resistance from a control logic 521 via their control inputs 523, 524.

Each digitally controlled resistor 517, 518 for example includes a plurality of resistors wherein via each resistor, the first input 519 and the second input 520, respectively, may be coupled to VSS. Each resistor of each digitally controlled resistor 517, 518 may be switched on or off by the control signal 522. For example, each digitally controlled resistor 518 includes 39 resistors which may be switched or off by the control signal 522 which is a digital control signal with 39 control bits.

From the signals RX_A and RX_B, the active rectifier control circuit 512 generates a signal Ialb 525 which represents the sum of the output signals of the voltage divider (i.e. the signals RX_A, RX_B) amplified by a certain gain.

The control logic 521 (which is part of the RxD branch) compares the peak voltage of the signal Ialb 525 with a reference signal vref_i 526 and increases or decreases the division factor of the resistor voltage divider by means of the control signal 522 if the peak voltage is larger or smaller than the reference voltage 526. Due to this control loop the peak voltage of the signal Ialb 525 is independent from the input voltage at the RxD/TxD pads 501, 502 of the antenna interface which varies in a certain range due to the variation of the field strength received by the antenna. The peak voltage controlled signal Ialb 525 is provided to a demodulator circuit (not shown).

The active rectifier circuit 512 and the control logic 521 may have further inputs and outputs, e.g. for enabling this components for RxD mode and disabling them in TxD mode, clock signals, reset signals, etc.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A chip card communication arrangement comprising:
   a matching network; and
   a chip card communication circuit comprising
      a first matching network terminal and a second matching network terminal;
      a receiver coupled to the matching network via the at least one matching network terminal; and
      an active transmitter coupled to the matching network via the at least one matching network terminal,
   wherein the matching network comprises a first capacitor coupled in parallel to the antenna and a second capacitor directly connected serially between the antenna and the at least one matching network terminal and wherein the matching network comprises a third capacitor directly connected serially between the antenna and the second matching network terminal.

2. Chip card communication arrangement according to claim 1, wherein the receiver is coupled to the matching network via the first matching network terminal and the second matching network terminal and the active transmitter is coupled to the matching network via the first matching network terminal and the second matching network terminal.

3. Chip card communication arrangement according to claim 2, wherein the matching network is configured such that its input impedance at the first matching network terminal and the second matching terminal matches the output impedance at the first output terminal and the second output terminal of the transmitter.

4. Chip card communication arrangement according to claim 2, wherein the receiver comprises a first input terminal coupled to the first matching network terminal and a second input coupled to the second matching network terminal.

5. Chip card communication arrangement according to claim 2, wherein the active transmitter comprises a first output terminal coupled to the first matching network terminal and a second output terminal coupled to the second matching network terminal.

6. Chip card communication arrangement according to claim 1, further comprising an antenna coupled to the matching network.

7. Chip card communication arrangement according to claim 6, wherein the antenna is coupled to the matching network such that the receiver and the transmitter are coupled to the antenna via the matching network.

8. Chip card communication arrangement according to claim 1, wherein the chip card communication circuit is arranged on a chip card.

9. Chip card communication arrangement according to claim 8, wherein the matching network is arranged on the chip card.

10. Chip card communication arrangement according to claim 8, further comprising an antenna wherein the antenna is arranged on the chip card.

11. Chip card communication arrangement according to claim 8, wherein the chip card is a dual interface card.

12. Chip card communication arrangement according to claim 9, wherein the active transmitter comprises a differential driver.

13. Chip card communication arrangement according to claim 1, further comprising a digital signal source coupled to an input of the transmitter and configured to supply a signal to be transmitted to the transmitter.

14. Chip card communication arrangement according to claim 1, further comprising a demodulator coupled to the receiver and configured to demodulate a signal received by the receiver.

15. Chip card communication arrangement according to claim 1, wherein the receiver comprises a control loop configured to generate a peak voltage controlled signal from a signal supplied by the matching network to the receiver.

16. A chip card communication arrangement comprising:
    a matching network; and
    a chip card communication circuit comprising
       a first matching network terminal and a second matching network terminal;
       a receiver coupled to the matching network via the at least one matching network terminal, the receiver comprising a control loop configured to generate a peak voltage controlled signal from a signal supplied by the matching network to the receiver; and
       an active transmitter coupled to the matching network via the at least one matching network terminal,
    wherein the matching network comprises:
       a first capacitor coupled in parallel to the antenna, a second capacitor coupled serially between the antenna and the at least one matching network terminal, and
a third capacitor coupled serially between the antenna and the second matching network terminal.

* * * * *